United States Patent [19]
Meulenberg, Jr.

[11] 4,395,583
[45] Jul. 26, 1983

[54] OPTIMIZED BACK CONTACT FOR SOLAR CELLS

[75] Inventor: Andrew Meulenberg, Jr., Gaithersburg, Md.

[73] Assignee: Communications Satellite Corporation, Washington, D.C.

[21] Appl. No.: 313,081

[22] Filed: Oct. 20, 1981

Related U.S. Application Data

[63] Continuation-in-part of Ser. No. 145,104, Apr. 30, 1980, abandoned.

[51] Int. Cl.$^3$ .............................................. H01L 31/06
[52] U.S. Cl. .................................... 136/256; 136/259; 357/30; 357/52; 357/65; 357/67; 357/71
[58] Field of Search ........................ 136/255, 256, 259; 357/30, 52, 65, 67, 71

[56] References Cited

U.S. PATENT DOCUMENTS

| | | | |
|---|---|---|---|
| 3,888,698 | 6/1975 | Lindmayer et al. | 136/256 |
| 3,907,595 | 9/1975 | Lindmayer | 136/255 |
| 3,988,167 | 10/1976 | Kressel et al. | 136/256 |
| 4,072,541 | 2/1978 | Meulenberg, Jr. et al. | 136/255 |
| 4,166,919 | 9/1979 | Carlson | 136/257 |

OTHER PUBLICATIONS

M. A. Green et al., "The MIS & MISIM Solar Cells," *Proceedings, Int'l Photovoltaic Solar Energy Conf.*, Luxembourg, 1977, Reidel Pub. Co., (1978), pp. 299–307.
J. C. C. Fan et al., "Proposed Design of a-Si:H Solar Cells Using Ultrathin Active Layer to Increase Conversion Efficiency," *Conf. Record, 14th IEEE Photovoltaic Specialists Conf.* (1980), pp. 1070–1073.

*Primary Examiner*—Aaron Weisstuch
*Attorney, Agent, or Firm*—Sughrue, Mion, Zinn, Macpeak and Seas

[57] ABSTRACT

The surface recombination velocity at the back portion of a solar cell is reduced in a first embodiment by reducing the back surface metal contact area without increasing series resistance. The back surface is provided with a p+ layer deposited on the solar cell p layer in order to further reduce the surface recombination velocity and therefore the diffusion current generated in the back layer of the cell. The p+ layer is provided with an oxide coating. Micro holes are etched through the oxide layer, and a thin layer of metal is evaporated over the entire surface. In a second embodiment the surface recombination velocity at the back portion of the cell is reduced by depositing a thin non-conductive coating on the p+ layer. A selected metal coating is then deposited on the non-conductive coating to thereby form a Mott-Schottky barrier, the metal coating retarding the transport of minority carriers through the non-conductive coating without impeding the flow of majority carriers through the non-conductive coating. In a third embodiment, the surface recombination velocity is reduced by depositing a conductive oxide on the p+ layer, and a metal coating is further deposited on the conductive oxide coating. The conductive oxide coating reduces surface recombination at the interface of the p+ and conductive oxide layers, and provides majority carriers to the p+ layer.

28 Claims, 9 Drawing Figures

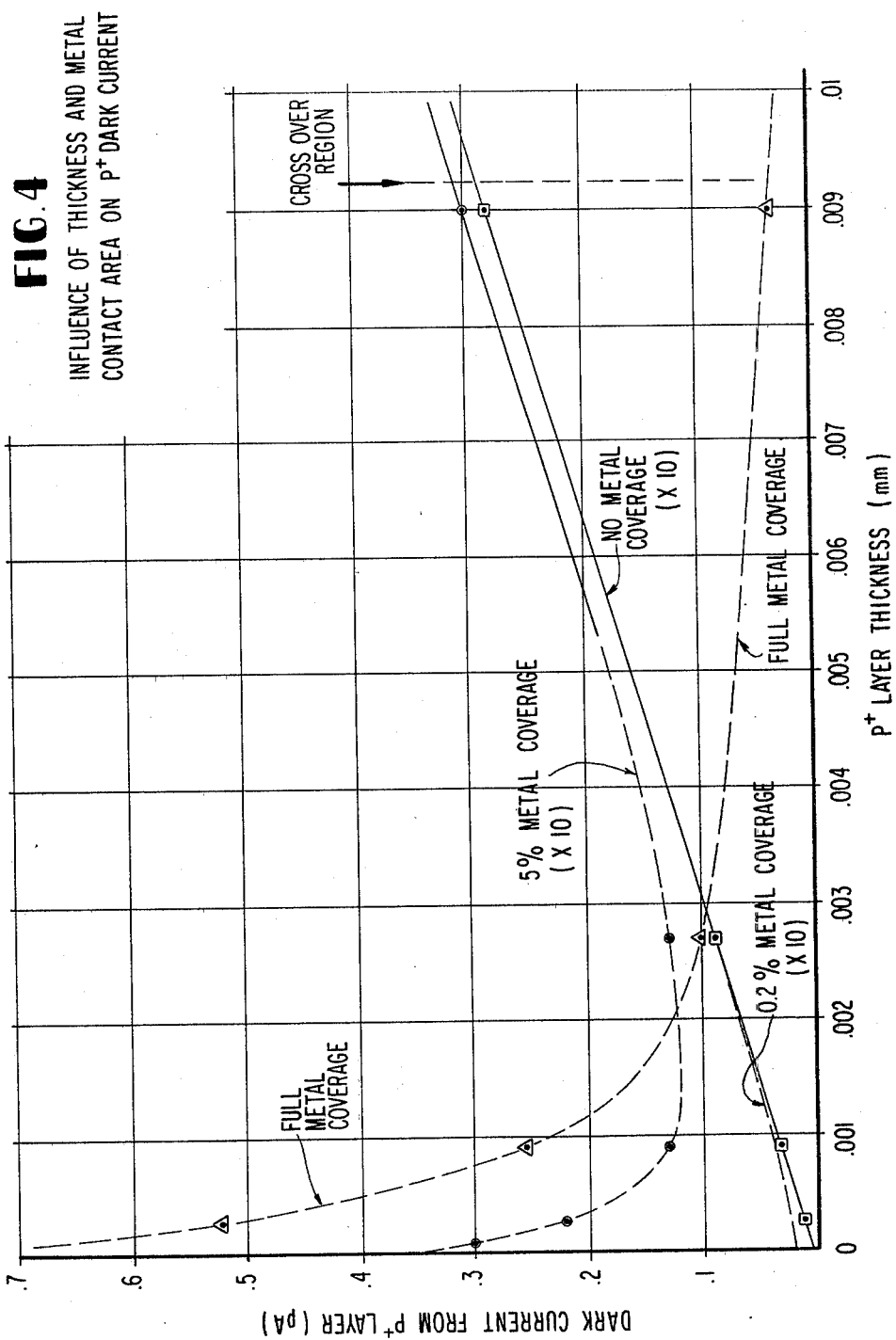

OPTIMIZED BACK CONTACT FOR SOLAR CELLS

This is a continuation-in-part of application Ser. No. 145,104, filed Apr. 30, 1980, now abandoned.

BACKGROUND OF THE INVENTION

It has been recognized that in thin solar cells, a reduction in the surface recombination velocity of the cell back surface will produce a reduction in the diffusion current generated in the back layer of the cell, thereby improving the cell open circuit voltage as well as increasing the collection of light generated carriers from this back region to thereby increase the short circuit current. One such technique for reducing the surface recombination velocity of a germanium solar cell is taught by Beck in U.S. Pat. No. 3,620,829, where the active surface of the germanium device is coated with antimony trioxide.

It has also been shown theoretically and verified experimentally that a p+ back layer as illustrated in FIG. 1 will reduce minority carrier transport between the p layer and the back surface and will accordingly improve the solar cell short circuit current and open-circuit voltage. The p+ layer 4 is deposited on the p layer 2 of an n+p type cell to form a back layer and is more heavily doped than the p layer of the cell. For an n+p cell, a p+ back layer is deposited on the p layer and will be used as an example throughout the specification. However, the same analysis is equally true for an n+ layer on a p+n cell, a p+ layer on an n+i cell, or an n+ layer on a p+i cell. The letter "i" indicates intrinsic material or high resistivity material that acts intrinsic under normal operating conditions. Deposited on the p+ back layer is an ohmic contact 6 provided to collect current generated by light. The structure consisting of the p+ back layer 4 and the ohmic contact 6 will herein be designated a "p+ back contact."

Previous attempts to improve p+ back contacts, such as the JPL Contract No. 954,833 to Solarex, have been only moderately successful. In those attempts an aluminum or aluminum bearing layer has been diffused into the whole back surface of solar cell. The result is expected to be a p+ layer formed from the diffused aluminum and terminating on the back side in an ohmic contact at the silicon-aluminum alloy layer.

A different type back layer is taught in U.S. Pat. No. 3,888,698 "Infrared-Transparent Solar Cell" in which an open metallic contact grid deposited on a p+ back layer is utilized to allow non-useful long wavelength light to pass through the back surface rather than be absorbed in the back layer. An oxide coating is deposited on the remaining exposed portions of the p+ layer to improve the thermal emissivity of the cell.

Theoretical analyses have been conducted on p+ back contacts. See M. P. Godlewski, C. R. Baraona, H. W. Brandhorst, "Low-High Junction Theory Applied to Solar Cells," *Conference Record, Tenth IEEE Photovoltaic Specialists Conference*, Palo Alto, CA, November 13-15, 1973, p. 40 and P. M. Dunbar and J. R. Hauser "A Theoretical Analysis of the Current-Voltage Characteristics of Solar Cells," Annual Report on NASA Grant NGR-34-002-195, August 1975, and NASA CR-134740, February 1975.

Optimization of the front structure for a shallow junction cell to reduce the front layer surface recombination velocity on using a minimum contact area is taught in U.S. Pat. No. 3,982,964 "Dotted Contact Solar Cell." The ohmic contacts are deposited directly on the n+ front layer in a manner to provide minimum contact between the electrode and the semiconductor material.

SUMMARY OF THE INVENTION

A modified solar cell back contact is provided in accordance with the present invention such that the surface recombination velocity at the back may be an order of magnitude lower than the best conventional back contact. This result is achieved in part by reducing the back surface metal contact area without increasing the series resistance, in a manner similar to that of U.S. Pat. No. 3,982,964 which reduces the front surface metal contact area without increasing series resistance. The back contact designed in accordance with the present invention is provided with a p+ layer deposited on the cell p layer in order to further reduce the surface recombination velocity and therefore the diffusion current generated in the back layer of the cell to thereby improve the cell efficiency.

In a first preferred embodiment of the present invention, a p+ layer having an oxide coating is provide on the p back surface of the cell to reduce the recombination velocity as much as possible. Micro holes are etched through the oxide layer and a thin layer of high purity aluminum is evaporated over the entire surface. This is then coated by evaporating chrome-gold and plating with silver. The resulting structure provides a metal contact covering a very small portion of the back surface area, a dielectric coating over the great majority of the back surface, a shallow p+ layer having a diffusion length which is long compared to the cross-sectional width ($W_{p+}$) or thickness of the p+ layer, and a polished aluminum optically reflecting layer on the top of the dielectric to reflect light back through the thin cell.

In the second preferred embodiment of the present invention, a p+ layer having a thin non-conductive oxide coating is provided on the p back surface of the cell to reduce the surface recombination velocity. A selected metal coating is deposited on the non-conductive coating whereby a Mott-Schottky barrier is formed by the non-conductive coating. The metal coating retards the transport of minority carriers through the non-conductive coating without impeding the flow of majority carriers through the non-conductive coating.

In a third preferred embodiment of the present invention a conductive oxide coating is deposited on the p+ layer to reduce surface recombination velocity. A metal coating is deposited on at least a portion of the conductive oxide coating. The conductive oxide coating reduces surface recombination at the second interface and provides majority carriers to the p+ layer.

BRIEF DESCRIPTION OF THE DRAWINGS

FIG. 4 is a plot of dark current from the p+ contact layer versus p+ layer thickness and percent metal coverage.

DESCRIPTION OF THE INVENTION

A solar cell p+ back contact in accordance with the present invention is fabricated with a minimum metallic contact area while at the same time maintaining a low series resistance within the cell assembly. Furthermore, the thickness of the p+ layer is small compared to the effective diffusion length L within the layer.

In a preferred embodiment of the invention, the back of the solar cell includes a very thin p+ layer deposited on the p layer of an n+p cell to form a shallow p⁻p+ junction. The p+ region can be formed on the layer in a conventional manner (P type dopants such as boron, aluminum, gallium or indium alone or in combination can be implanted, diffused or alloyed into the back surface from a gas, metal, glass or slurry source). The p+ layer is further provided with an oxide coating on the surface to reduce the recombination velocity at the surface, $S_s$, as much as possible.

Figure 2A:
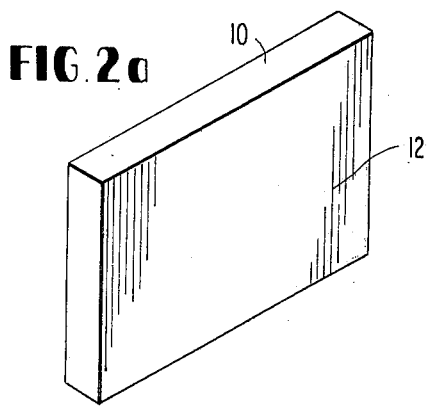
FIG. 2a illustrates the silicon solar cell in accordance with the present invention having an electrode portion covering the entire cell back surface.
Figure 2B:
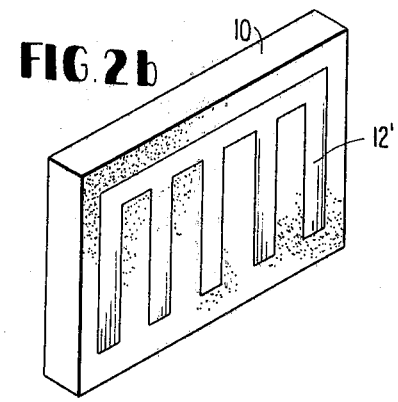
FIG. 2b is an alternative arrangement of the electrode portion of the cell.
Figure 2C:
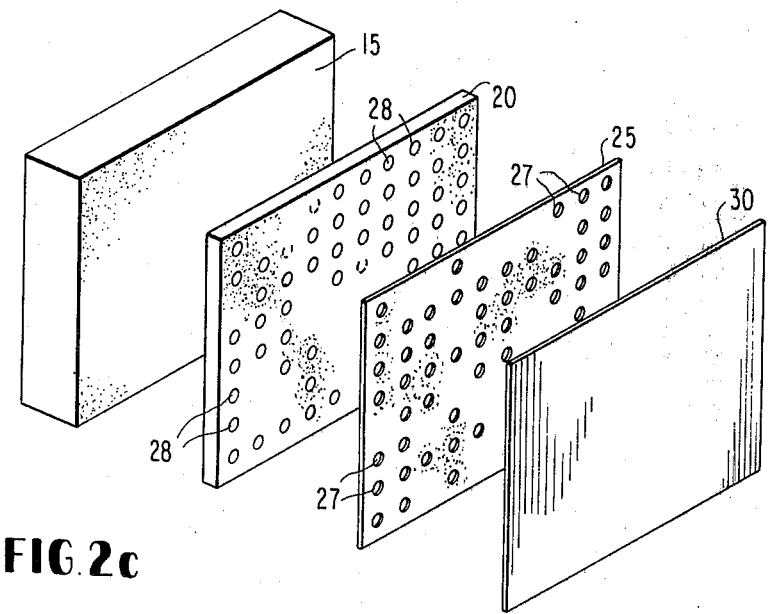
FIG. 2c is an exploded view of the electrode portion of FIGS. 2a or 2b and illustrates the composition of the optimized back contact.
Figure 5:
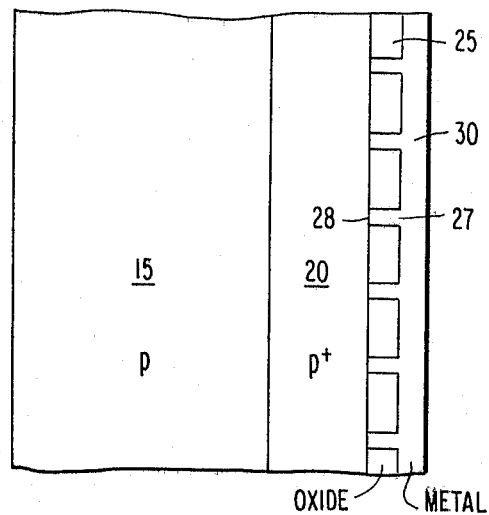
FIGS. 5-7 illustrate in detail the composite structure of the optimized back contact.

FIG. 2a illustrates a solar cell 10 having a current collecting electrode 12 which covers the entire rear surface of the cell. The electrode 12 alternatively can cover only certain portions of the cell as illustrated with reference to the grid structure 12' of FIG. 2b. With reference to FIGS. 2c and 5, the p⁻p+ junction is formed by p and p+ layers 15 and 20, respectively. An oxide layer 25 is deposited on the p+ layer and closely spaced (~100 μm apart) micro holes 27 are etched therethrough. A thin layer (~500 Å) of high purity aluminum 30 is evaporated over the whole surface to form the cell contact at areas 28. The aluminum coating is further coated by evaporating chrome-gold and plating with silver. The aluminum is heat treated to form an ohmic contact to the silicon p+ layer. The final structure provides the desired result of (a) a metal contact at spots 28 covering as little as 0.1% of the back surface area; (b) a dielectric coating over as much as 99.9% of the back surface; (c) a very thin p+ layer with a diffusion length which is long compared to the thickness of the p+ layer; and (d) a polished aluminum optically reflecting layer on top of the dielectric to return light back through the thin cell.

Figure 1:
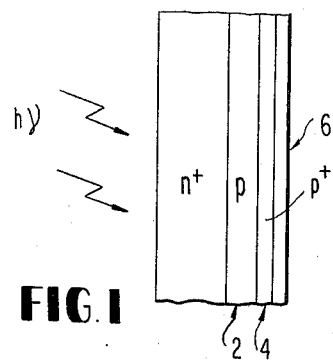
FIG. 1 illustrates a conventional p+ back structure.
Figure 3:
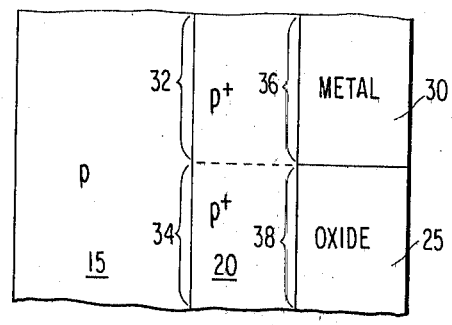
FIG. 3 illustrates the various regions of surface recombination.

FIG. 3 shows the various regions where the surface recombination velocities must be evaluated or considered. Like regions (p, p+, oxide and metal) in each of the FIGS. 2c, 3 and 5-7 are identified with identical reference numerals. The effective surface recombination velocity associated with the p⁻p+ junction underneath the metal 30 (region 32) is designated as $S_{pp+}^m$, where the subscript pp+ and superscript m indicate that the velocity S is evaluated at the p⁻p+ junction under the metal. Region 34 has a velocity $S_{pp+}^o$, indicating that it is evaluated at the p⁻p+ junction underneath the oxide. Regions 36 and 38 have velocities $S_s^m$ and $S_s^o$, respectively, where the subscript s indicates that the velocity is evaluated at the silicon surface or interface (either p+-metal or p+-oxide), while the superscripts m and o again indicate whether the interface is under the metal 30 or oxide 25 regions, respectively.

The operational characteristics of the structure in accordance with the present invention are best seen in comparison with the conventional structure. The effective surface recombination velocity $S_{pp+}^m$ of a conventional pp+ structure with metallic contact ($S_s^m \approx 10^6$ cm/sec, typical) is defined as:

$$S_{pp+}^m = \frac{n_{p+}}{n_p} \cdot \frac{D_{np+}}{L_{np+}} \coth \frac{W_{p+}}{L_{np+}} \quad (1)$$

where $n_{p+}$ and $n_p$ are the minority carrier concentrations in the p+ and p regions and $D_{np+}$ and $L_{np+}$ are the minority carrier diffusion coefficient and diffusion length in the p+ region of cross-sectional width $W_{p+}$. The surface recombination velocity of a pp+ structure with a good oxide back surface ($S_s^o$ small, typically <20 cm/sec) is $$S_{pp+}^o = \frac{n_{p+}}{n_p} \cdot \frac{D_{np+}}{L_{np+}} \tanh (W_{p+}/L_{np+}). \quad (2)$$

To help in evaluating these two different conditions we will assume $W_{p+} << L_{np+}$; therefore, $\coth W_{p+}/L_{np+} \cong L_{np+}/W_{p+}$ and $\tanh W_{p+}/L_{np+} \cong W_{p+}/L_{np+}$. The values of $S_{pp+}$ therefore become:

$$S_{pp+}^m \cong \frac{n_{p+}}{n_p} \cdot \frac{D_{np+}}{W_{p+}} \quad \text{for metal contact} \quad (3)$$

$$S_{pp+}^o \cong \frac{n_{p+}}{n_p} \cdot \frac{W_{p+}}{\tau_{np+}} \quad \text{for oxide contact, where} \quad (4)$$
$$\tau_{np+}^{-1} = D_{np+}/L_{np+}^2$$

It is apparent that underneath the metal back contact a large $W_{p+}$ is needed to keep $S_{pp+}$ small, while the reverse is true for the oxide back. In addition, it is readily seen that for thin p+ layers, $S_{pp+}$ for the oxide contact is very much lower than that for the metal contact. This is illustrated in FIG. 4 which is a plot of dark current from the p+ layer as a function of p+ layer thickness and metal contact area. The plots for no metal, 0.2% metal, and 5% metal coverage have been multiplied by 10 so that they can easily be illustrated on the same graph as the full metal coverage plot. As noted above, the dark current is dependent upon the surface recombination velocity and must be minimized for efficient cell operation. The plot for the full metal coverage reveals an undesirably high dark current with decreasing p+ layer thickness. As the thickness increases, however, the dark current for the full metal coverage becomes smaller. The plots of partial metal coverage indicate a lower dark current than full metal coverage for all values of p+ thickness less than approximately 9 μm (cross-over region). The 5% metal coverage plot illustrates the influence of the metal coverage at low values of p+ layer thickness, while at greater values of thickness, the p+ bulk layer controls. Finally, it can be seen that for full oxide coverage (no metal coverage), as well as 0.2% metal coverage, the p+ contact dark current increases linearly with layer thickness.

In most cases, it is necessary to have some metal contact on the back to collect current passing through the cell. But the amount of metal contact can be reduced to less than 0.1% by use of distributed point contacts (points 28). With the metal and oxide contact areas designated as $A_m$ and $A_o$, respectively, the average or effective $S_{pp+}^E$ will be defined as:

$$S_{pp+}^E = (S_{pp+}^o A_o + S_{pp+}^m A_m)/A_{total}. \quad (5)$$

A generalized form of Equation 5, to include nn+ as well as pp+ structures, can be written by substituting Equations 3 and 4 into Equation 5 and generalizing the minority carrier concentrations so that $n_{p+}$ and $p_{n+}$ are represented by x, and $N_p$ and $P_n$ are represented by y. Similarly, $W_{p+}$ and $W_{n+}$ are represented by W, $D_{np+}$ and $D_{pn+}$ by D, and $L_{np+}$ and $L_{pn+}$ by L. Accordingly, $$S_{pp+}^E = \frac{A_o(x/y)(W \cdot D/L^2) + A_m(x/y)(D/W)}{A_{total}}.$$

Advantageously, the ratio W/L should be chosen so that the value of $S_{pp+}^E$ is reduced below (x/y)(D/L), or so that the value of $S_{pp+}^E$ is minimized.

Optimizing the value of $W_{p+}/L_{np+}$ to minimize $S_{pp+}^E$ gives $(W/L_{np+})=0.03$ for $A_m=0.001$ A. However, for such small values of $W/L_{np+}$, $S_s^o$ must be $\lesssim 20$ cm/sec for the above approximation of $S_{pp+}^o$ to hold. If $S_s^o \cong 1000$ cm/sec then $$(S_{pp+}^o)_{1000} = \frac{n_{p+}}{n_p} \frac{D_{np+}}{L_{np+}} \frac{S_s^o L_{np+}}{D_{np+}} = \frac{n_{p+}}{n_p} S^o. \quad (6)$$

If $W/L_{np+} >> 1$ (for optimum case of $S_{pp+}^m$), then coth $W/L \cong 1$ and $$(S_{pp+}^m)opt. \cong (n_{p+}/n_p) \cdot (D_{np+}/L_{np+}) \cdot 1. \quad (7)$$

Substituting values of $n_{p+}/n_p \cong 10^{-3}$, $D_{np+}=3.4$ cm²/sec, and $L_{np+} \cong 5 \mu m = 5 \times 10^{-4}$ cm, it follows that:

$$S_{pp+}^m = 10^{-3} \cdot (3.4 \text{ cm}^2/\text{sec})/W_{p+}, \quad \text{(from eq. 3)}$$

$$S_{pp+}^o = W_{p+} \cdot 10^{-3} \cdot (3.4 \text{ cm}^2/\text{sec}/(5 \times 10^{-4} \text{ cm})^2) = 1.4 \times 10^4 \, W_{p+}/\text{sec}, \quad \text{(from eq. 4)}$$

$$(S_{pp+}^o)_{1000} = S_s^o \cdot 10^{-3} = 1 \text{ cm/sec, and} \quad \text{(from eq. 6)}$$

$$(S_{pp+}^m)_{opt} \cong 10^{-3} \cdot (3.4 \text{ cm}^2/\text{sec}/5 \times 10^{-4} \text{ cm}) = 7 \text{ cm/sec.} \quad \text{(from eq. 7)}$$

For $W_{p+} = 0.15 \mu m = 1.5 \times 10^{-5}$ cm;

$S_{pp+}^m \cong 200$ cm/sec;

$S_{pp+}^o \cong 0.2$ cm/sec, for $S_s^o \lesssim 20$ cm/sec;

and $S_{pp+}^E = 0.4$ cm/sec.

It can therefore be seen that the effective surface recombination velocity taught in accordance with the present invention $(S_{pp+}^E \cong 0.4$ cm/sec) is more tha an order of magnitude better (lower) than the best surface recombination velocity taught in the prior art $[(S_{pp+}^m)_{opt} \cong 7$ cm/sec] if $S_s^o \lesssim 20$ cm/sec. If the oxide-silicon interface velocity cannot be improved to much better than $S_s^o \cong 1000$ cm/sec, the $(S_{pp+}^E)_{1000}$ value is still better than $(S_{pp+}^m)_{opt}$ by a factor of 6 and it is much easier to obtain since $(S_{pp+}^m)_{opt}$ has never been achieved.

Figure 7:
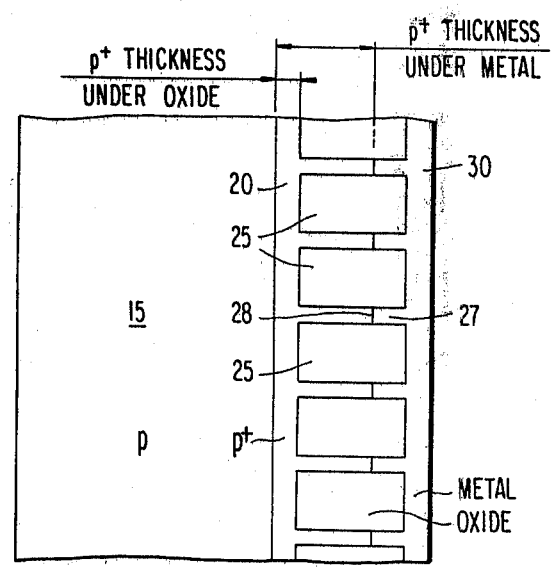

An additional means of optimizing effectiveness of the p+ back contact is a slight variation on the point contact theme. Since $S_{pp+}^m$ decreases with increasing $W_{p+}$ and $S_{pp+}^o$ decreases with decreasing $W_{p+}$, it is useful to deviate from the previous structure which assumes a constant $W_{p+}$ and which only reduces the area covered by the metal contacts. The new structure as illustrated in FIG. 7 would have a very thin p+ layer at 28, along with a lower $L_{np+}$, under the metal contacts 27. This can be achieved by either selective diffusion or by deep diffusion and subsequent etching to lower $W_{p+}$ for the region to be covered by the oxide. The optimized effective surface recombination velocity for this case would be:

$$(S_{pp+}^E)_{opt} = (S_{pp+}^o \cdot A_o + (S_{pp+}^m)_{opt} \cdot A_m)/A_{total}$$

$$\cong (1.4 \times 10^4 \, W_{p+}^o/\text{sec}) + 7 \text{ cm/sec } A_m/A_{total},$$

where $A_o$ and $A_m$ are the areas of oxide and metal coverage, respectively. If $A_m/A_{total}=0.01$ and the thickness of the p+ layer under the oxide $W_{p+}^o=2\times 10^{-6}$ cm, then $(S_{pp+}^E)_{opt} \cong 0.1$ cm/sec. Realistic values of $W_{p+}^o$ are likely to be greater than $2 \times 10^{-6}$ cm, but the dominant term in $(S_{pp+}^E)_{opt}$ is controlled by $A_m$ which can easily be reduced below 0.01 $A_{total}$.

Low recombination velocity back surfaces are most important on thin solar cells (the thinner the cell the more important) and the best "conventional" back contact $(S_{pp+}^m)opt$ has a back contact layer which is thick compared to the minority carrier diffusion length in that region. Light generated carriers in the p+ region (which may be 10% of the total cell thickness) are not all collected.

Therefore, in the conventional art a tradeoff must be made between $V_{oc}$ and $I_{sc}$. This tradeoff is unnecessary with the point contact p+ back which gives a higher $V_{oc}$ with no loss in $I_{sc}$.

Figure 6:
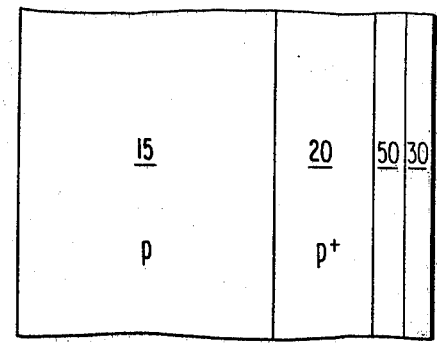

With reference to FIG. 6, two cases, the second and third embodiment, exist where metal contacts to the p+ layer are not necessary for the collection of cell current. A forward biased Mott-Schottky barrier in the second embodiment or a conductive oxide in the third embodiment can pass current without introducing high values of $S_s^m$ associated with the metal ohmic contact.

The Mott-Schottky barrier is comprised of a metal-oxide semiconductor structure in the case of an MOS structure or a metal-insulator-semiconductor in the case of an MIS structure. For the purposes of the descriptions herein, non-conductive layer, insulator and insulating layer are used interchangeably. Examples of suitable barrier material are silicon oxide and silicon nitride. The non-conductive layer, as shown at 50, is deposited over the entire back surface and is made thin enough to pass current between the silicon and the metal back contact 30 without introducing significant series resistance and yet thick enough to prevent formation of an ohmic contact. As the non-conductive layer thickness diminishes, the Mott-Schottky barrier approaches a Schottky barrier which includes no non-conductive layer. Since the optimum non-conductive layer thickness is between approximately 25 and 200 Å, usually 50 Å, the structure can be referred to as an MOS (or MIS) barrier. The insulating layer is covered with the metal film 30 having the appropriate work function to retard the transport of minority carriers through the insulating layer without impeding the flow of majority carriers. The use of chrominum for n+ type layers and gold for p+ type layers are examples of metal films having the foregoing characteristics. Mathematically, the metal-insulator-semiconductor back is treated in the same manner as for the point contact back for surface recombination velocities evaluated at the p⁻p+ junction as described in equations 4 and 6.

In the third embodiment, the conductive oxide (also arranged at layer 50, FIG. 4, can consist of indium-tin oxide (ITO) and is provided to reduce surface recombination velocities evaluated at the p⁻p+ junction as described in equations 4 and 6.

In the third embodiment, the conductive oxide (also arranged at layer 50, FIG. 4) can consist of indium-tin oxide (ITO) and is provided to reduce surface recombination at the oxide-silicon interface and to provide majority carriers to the p+ silicon layer. The thickness of this oxide layer is not critical since it is not an insulating layer as in the case of the Mott-Schottky barrier. If metal grids such as those taught in U.S. Pat. No. 3,982,964 are used as the final current collection structure, thick ITO could be employed to reduce the total series resistance of the system. The ITO-silicon interface surface recombination velocity $S_s^o$ is low to provide the characteristics for mathematical treatment in accordance with equations 4 or 6. As some of the conductive oxides are naturally reduced by some semiconductors (for example ITO by n+ silicon), the resulting silicon oxide forms the MOS structure previously described. As the thickness of this newly formed silicon oxide becomes greater than approximately 20 Å, the resulting structure is a combination of the conductive oxide structure and the MOS structure and can therefore be treated mathematically in a manner similar to these structures individually, as will be recognized by one skilled in the art.

Various changes, additions and omissions of elements may be made within the spirit and scope of the invention and it is to be understood that the invention is not limited to specific details and examples described herein.

I claim:

1. A solar cell having a first extrinsic semiconductor layer providing majority carriers of a first electrical charge, a second semiconductor layer adjacent to said first layer, and a back contact optimized to reduce effective surface recombination, said optimized back contact comprising:
   (a) a third extrinsic semiconductor layer having a thickness (W) substantially less than its minority carrier diffusion length (L), adjacent to said second layer to form a first interface having a low effective surface recombination velocity, said third layer providing a number of majority carriers of a second electrical charge opposite to said first electrical charge;
   (b) a non-metallic coating deposited on said third layer to form a second interface having a low surface recombination velocity, said non-metallic coating having a plurality of micro holes provided therethrough, the total area of said micro holes being small relative to the total area of said non-metallic coating; and
   (c) a metal coating deposited on said non-metallic coating to thereby provide electrical contacts from said metal coating to said third layer through said micro holes to form a third interface at said electrical contacts, wherein the ratio (W/L) of the width (W) of said third layer to the minority carrier diffusion length (L) in said third layer is chosen so as to reduce the quantity:

$$\frac{A_o(x/y)(W \cdot D/L^2) + A_m(x/y)(D/W)}{A_{total}}$$

below $(x/y)(D/L)$ where x and y are the minority carrier concentrations in said third and second layers, respectively; D is the minority carrier diffusion coefficient of said third layer; and $A_o$, $A_m$ and $A_{total}$ are the relative areas of said second, third and first interfaces, respectively.

2. The solar cell of claim 1 wherein said metal coating is optically reflective so as to reflect light reaching said metal coating back through said solar cell.

3. The solar cell of claim 1 wherein said second layer is an extrinsic semiconductor layer having a number of majority carriers of said second charge, said number of majority carriers in said second layer being less than said number of majority carriers in said third layer.

4. The solar cell of claim 3 wherein said first layer is an n+ layer, said second layer is a p layer and said third layer is a p+ layer.

5. The solar cell of claim 3 wherein said first layer is a p+ layer, said second layer is an n layer, and said third layer is an n+ layer.

6. The solar cell of claim 1, wherein said second layer is an intrinsic semiconductor layer.

7. The solar cell of claim 6, wherein said first layer is an n+ layer and said third layer is a p+ layer.

8. The solar cell of claim 6 wherein said first layer is a p+ layer and said third layer is an n+ layer.

9. The solar cell of claim 1 wherein said surface recombination velocity at said second interface is less than approximately 20 cm/sec.

10. The solar cell of claim 9 wherein said non-metallic coating is an oxide.

11. The solar cell of any one of claims 1-8 wherein said total area of said plurality of micro holes constitutes less than approximately 5% of said total area of said non-metallic coating.

12. The solar cell of any one of claims 1-8 wherein said third layer at said second interface is thinner than at said third interface.

13. A solar cell having a first extrinsic semiconductor layer providing majority carriers of a first electrical charge, a second semiconductor layer adjacent said first layer, and a back contact optimized to reduce surface recombination, said optimized back comprising:
   (a) a third extrinsic semiconductor layer having a thickness (W) substantially less than its minority carrier diffusion length (L) adjacent said second layer to form a first interface having a low effective surface recombination velocity, said third layer providing majority carriers of a second electrical charge opposite to said first electrical charge;
   (b) an insulating coating deposited on said third layer to form a second interface having low surface recombination velocity;
   (c) a metal coating deposited on at least a portion of said insulating coating whereby a Mott-Schottky barrier is formed by said insulating coating, said metal coating selected to retard the transport of minority carriers through said insulating coating without strongly impeding the flow of majority carriers through said insulating coating.

14. The solar cell of claim 13 wherein said insulating coating is from approximately 25 to 200 Å thick.

15. The solar cell of claims 13 or 14 wherein said insulating coating is comprised of silicon oxide or silicon nitride.

16. The solar cell of claims 13 or 14 wherein said metal coating is comprised of chromium or gold.

17. A solar cell having a first extrinsic semiconductor layer providing majority carriers of a first electrical charge, a second semiconductor layer adjacent to said first layer, and a back contact optimized to reduce effective surface recombination, said optimized back contact comprising:

(a) a third extrinsic semiconductor layer having a thickness (W) substantially less than its minority carrier diffusion length (L), adjacent to said second layer to form a first interface having a low effective surface recombination velocity, said third layer providing a number of majority carriers of a second electrical charge opposite to said first electrical charge;

(b) an electrically conductive non-metallic coating deposited on said third layer to form a second interface having a low surface recombination velocity, said non-metallic coating having a plurality of micro holes provided therethrough, the total area of said micro holes being small relative to the total area of said non-metallic coating; and (c) a metal coating deposited on said non-metallic coating to thereby provide electrical contacts from said metal coating to said third layer through said micro holes to form a third interface at said electrical contacts, wherein the ratio (W/L) of the width (W) of said third layer to the minority carrier diffusion length (L) in said third layer is chosen to minimize the quantity:

$$\frac{A_o(x/y)(W \cdot D/L^2) + A_m(x/y)(D/W)}{A_{total}}$$

where x and y are the minority carrier concentrations in said third and second layers, respectively; D is the minority carrier diffusion coefficient of said third layer; and $A_o$, $A_m$ and $A_{total}$ are the relative areas of said second, third and first interfaces, respectively.

18. The solar cell of claim 17 wherein said metal coating is optically reflective so as to reflect light reaching said metal coating back through said solar cell.

19. The solar cell of claim 17 wherein said second layer is an extrinsic semiconductor layer having a number of majority carriers of said second charge, said number of majority carriers in said second layer being less than said number of majority carriers in said third layer.

20. The solar cell of claim 19 wherein said first layer is an n+ layer, said second layer is a p layer and said third layer is a p+ layer.

21. The solar cell of claim 19 wherein said first layer is a p+ layer, said second layer is an n layer, and said third layer is an n+ layer.

22. The solar cell of claim 17 wherein said second layer is an intrinsic semiconductor layer.

23. The solar cell of claim 22 wherein said first layer is an n+ layer and said third layer is a p+ layer.

24. The solar cell of claim 22 wherein said first layer is a p+ layer and said third layer is an n+ layer.

25. The solar cell of claim 17 wherein said surface recombination velocity at said second interface is less than approximately 20 cm/sec.

26. The solar cell of claim 25 wherein said non-metallic coating is an electrically conductive oxide.

27. The solar cell of any one of claims 17–24 wherein said total area of said plurality of micro holes constitutes less than approximately 5% of said total area of said non-metallic coating.

28. The solar cell of any one of claims 17–24 wherein said non-metallic coating is from approximately 25 to 200 Å thick.

* * * * *